(12) United States Patent
Hino

(10) Patent No.: US 7,453,385 B2
(45) Date of Patent: Nov. 18, 2008

(54) D/A CONVERTER

(75) Inventor: Yasufumi Hino, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/776,464

(22) Filed: Jul. 11, 2007

(65) Prior Publication Data

US 2008/0079618 A1 Apr. 3, 2008

(30) Foreign Application Priority Data

Jul. 13, 2006 (JP) ............................ P2006-192439

(51) Int. Cl.
*H03M 1/66* (2006.01)
(52) U.S. Cl. ..................... 341/145; 341/155; 341/154
(58) Field of Classification Search ................ 341/155, 341/145, 136, 138, 154
See application file for complete search history.

(56) References Cited

U.S. PATENT DOCUMENTS

| | | | | |
|---|---|---|---|---|
| 4,638,303 A | * | 1/1987 | Masuda et al. | ............... 341/136 |
| 5,119,095 A | * | 6/1992 | Asazawa | ..................... 341/154 |
| 2003/0141998 A1 | * | 7/2003 | Matsui | ......................... 341/145 |
| 2005/0128112 A1 | * | 6/2005 | Miyata et al. | ................ 341/138 |

FOREIGN PATENT DOCUMENTS

JP 07-131354 5/1995

OTHER PUBLICATIONS

Iwao Sagara, "Introduction to A/D and D/A Converting Circuits", Second Edition, published by Nikkan Kogyo Shimbunsha, Sep. 30, 2004, pp. 268-269.

* cited by examiner

*Primary Examiner*—Jean B Jeanglaude
(74) *Attorney, Agent, or Firm*—Finnegan, Henderson, Farabow, Garrett & Dunner, L.L.P.

(57) ABSTRACT

A D/A converter includes: an (N−1)-stage reference resistor group; an N-stage reference resistor group; inter-stage op-amps applying a divided voltage outputted from voltage taps of the (N−1)-stage reference resistor group, across both ends of the N-stage reference resistor group as the $N^{th}$ reference voltage; a dynamic range expanding means for arranging the voltage taps in the (N−1)-stage reference resistor group so as to expand upward and downward, to expand an input dynamic range in the N-stage reference resistor group; and expansion resistors arranged respectively at both upper and lower ends of the N-stage reference resistor group in response to upward and downward expanded amounts of the dynamic range.

2 Claims, 8 Drawing Sheets

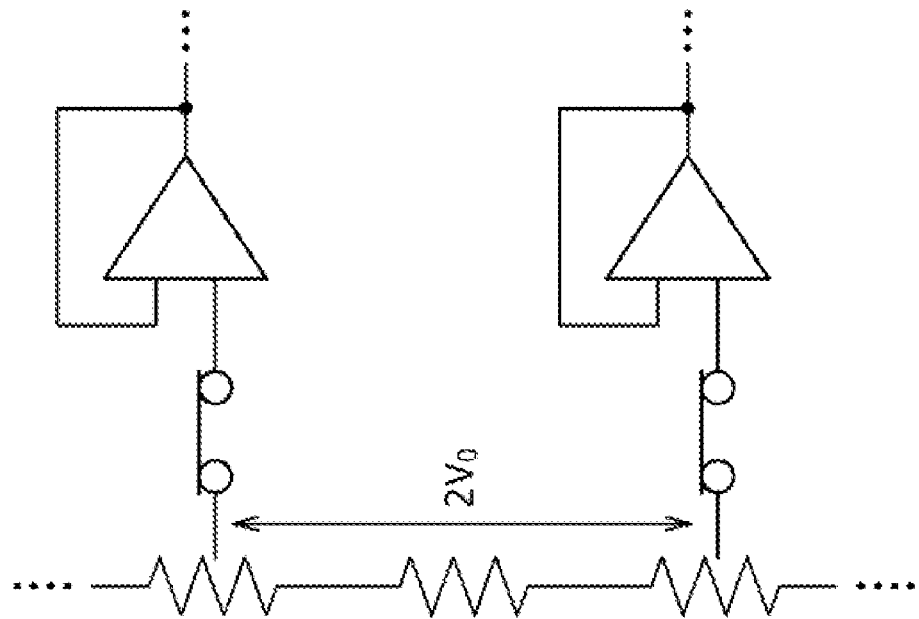
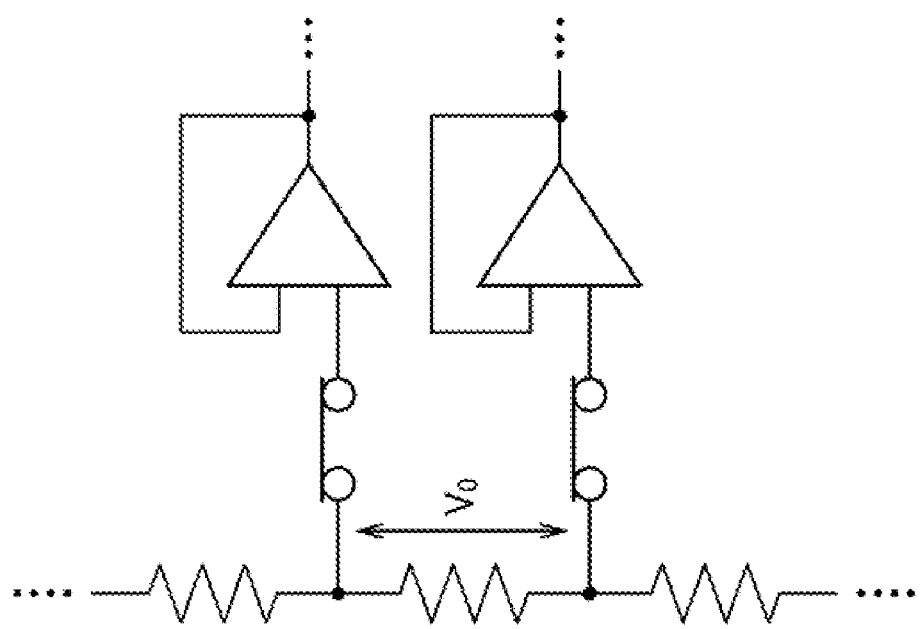

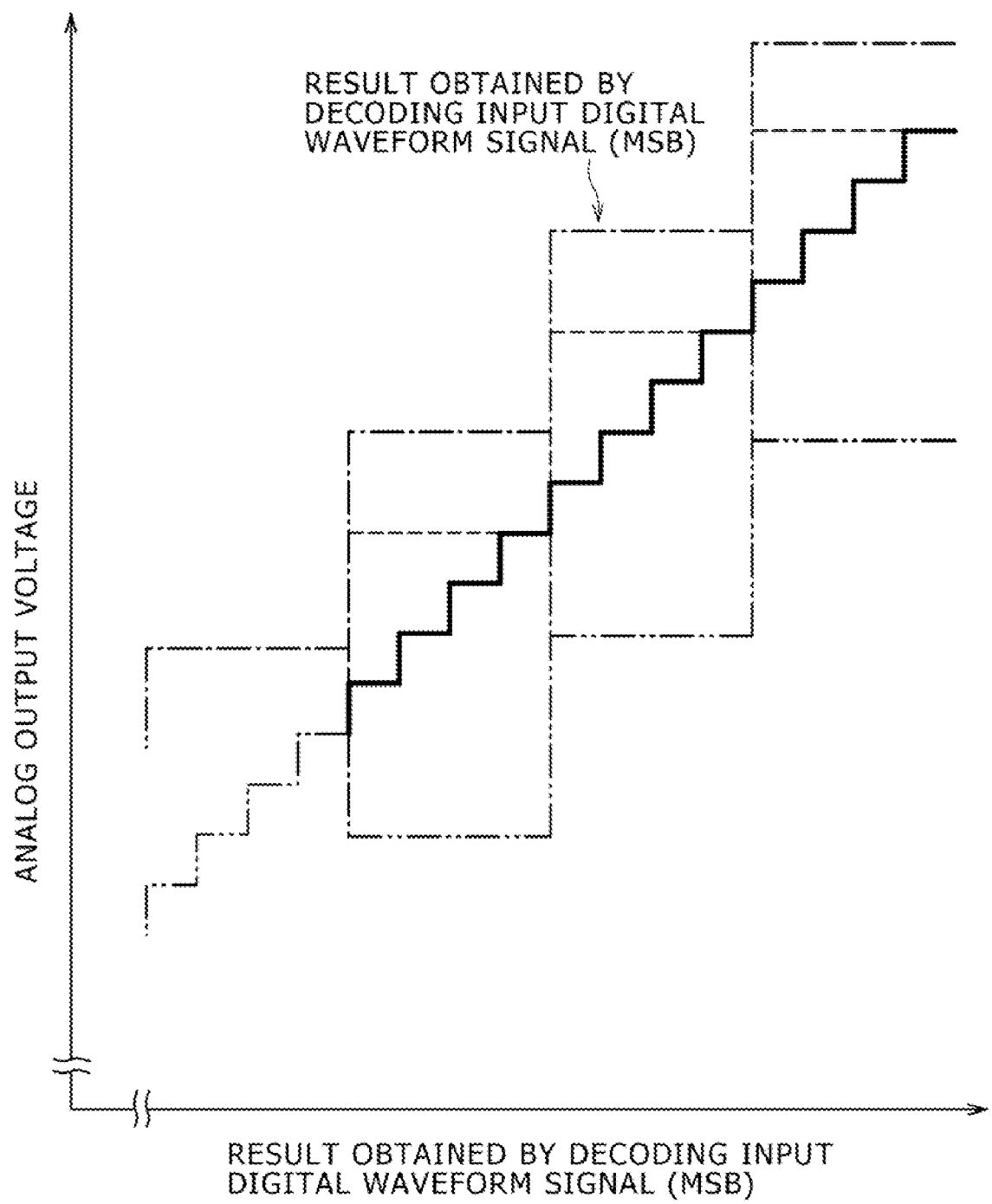

D/A CONVERTER

BACKGROUND OF THE INVENTION

1. Field of the Invention

The present invention relates to a D/A converter that outputs an analog waveform signal level corresponding to digital waveform signal data. Specifically, the present invention relates to a resistive voltage dividing type D/A converter that divides a reference voltage using a group of serially connected reference resistors in response to a binary code obtained by decoding a digital input signal, to output an analog voltage.

More specifically, the present invention relates to a multi-stage resistive voltage dividing type D/A converter in which a plurality of reference resistor groups are arranged in multiple stages, and particularly, to a multi-stage resistive voltage dividing type D/A converter that eliminates or alleviates influence of the offset voltage of inter-stage output amplifiers caused by a decreased dynamic range.

2. Description of Related Art

In information devices such as computers, a circuit for conversion of a digital signal to an analog signal, i.e., a D/A converter is usually used in order to transmit digitally processed data to a communication channel or output the data in audio or video form.

D/A converters include various types, such as converting circuits using a summing amplifier, resistive voltage dividing type circuits, and current output type circuits. Of these types, the resistive voltage dividing type D/A converter is configured such that a reference voltage using reference resistors is divided in response to a binary code obtained by decoding a digital input signal (see, e.g., Iwao Sagara, "Introduction to A/D and D/A converting circuits, Second Edition" published by Nikkan Kogyo Shimbunsha, Sep. 30, 2004 (pages 268-269)). The reference will be referred to as Non-Patent Reference 1 below. The resistive voltage dividing type D/A converter is satisfactory in its monotonously increasing property and differential nonlinearity, and is thus well adapted to servomechanisms.

The resistive voltage dividing type D/A converter is configured as follows. The circuit has a reference resistor group and an output amplifier, such as an op-amp. In the reference resistor group, a plurality of reference resistors, each having the same resistance value, are serially connected, and across such reference resistor group, a predetermined reference voltage is applied. A divided voltage is extracted from a voltage tap between certain reference resistors of a predetermined N (N=1, 2,. . . ) successive ones of the plurality of reference resistors. The divided voltage is extracted as an analog waveform signal via the output amplifier.

An output terminal is provided via an analog switch at each of nodes between adjacent reference resistors, whereby a voltage tap can be selected by on/off control of the corresponding switch. A digital input signal is decoded, and a voltage tap is determined, and then the analog switch at the determined tap is turned on to extract a divided voltage.

Here, it the analog switch is to be formed only of either a p-channel or n-channel transistor, a linear switching operation cannot be performed over a 0-5V full range required for conversion. To overcome this situation, a D/A converter has been proposed (see, e.g., Japanese Patent Application Publication No. HEI 07-131354 (Patent Reference 1)). In Patent Reference 1, p-channel MOS transistors are used for a high-level output and n-channel MOS transistors are used for a lower-level output, whereby the p-channel and n-channel MOS transistors which are adjacent to each other at the boundary between the respective analog switch groups are set to an equal impedance or conductance, to improve analog output characteristics.

FIG. 4 shows a configuration example of a 5-bit, 1-stage resistive voltage dividing type D/A converter. The D/A converter shown in the figure includes a reference resistor group consisting of $2^5$ series-connected reference resistors, and $2^5$ switches for switching positions for applying voltage to these resistors. Reference voltages $V_{refHigh}$ and $V_{refLow}$ providing a full-scale voltage are applied across this reference resistor group. Based on each of $2^5$ binary codes obtained by decoding a digital input signal via a decoder circuit, not shown, the corresponding one of the switches is selected, whereby a divided analog voltage is outputted to a downstream output amplifier.

As seen from FIG. 4, in the case of the 5-bit resistive voltage dividing type D/A converter, 32 (=$2^5$) switches are arranged in parallel, and the outputs of these switches are supplied to the downstream output amplifier (such as an op-amp). The number of switches increases with increasing number of bits, such as 128 switches for a 7-bit configuration, and 512 switches for an 8-bit configuration. When bearing an extremely large load capacitance due to supplied parallel outputs from the switches, the output amplifier becomes hard to drive. Hence, this type of D/A converter is considered unsuitable for high-speed operation. For example, even if a capacitance of each switch with its wiring capacitance equals 10 fF, so large a load capacitance as 128×10 fF=1.28 pF is connected to the input of the op-amp for the 7-bit configuration.

As a scheme for reducing the load capacitance of the resistive voltage dividing type D/A converter, a multi-stage resistive voltage dividing type D/A converter is known. According to this scheme, a plurality of reference resistor groups are provided in a resistive voltage dividing type D/A converter (see, e.g., Non-Patent Reference 1), whereby the load capacitance per stage can be reduced, to achieve higher-speed operation compared with the single-stage resistive voltage dividing scheme. Additionally, its operating principle is based on the resistive voltage dividing scheme, and hence satisfactory monotonously increasing property and differential nonlinearity can be obtained. Furthermore, compared with the single-stage resistive voltage dividing scheme, the design of a decoder becomes simpler, allowing for lower power consumption.

FIG. 5 shows a configuration example of a two-stage multi-stage resistive voltage dividing type D/A converter. In the D/A converter shown in the figure, a reference resistor group circuit includes a first-stage reference resistor group for outputting a rough analog voltage value, and a second-stage reference resistor group for outputting a fine analog voltage value. Of binary data obtained by decoding a digital input signal, a Most Significant Bit (MSB) bit is inputted to the first-stage reference resistor group and a Least Significant Bit (LSB) bit to the second-stage reference resistor group. Furthermore, the reference voltages $V_{refHigh}$ and $V_{refLow}$ providing a full-scale voltage are applied across the first-stage reference resistor group.

First, in the first-stage reference resistor group, two voltage taps are selected according to a decoded MSB bit, and in response thereto, the two corresponding analog switches are turned on to extract two different voltages. The two output voltages from the first-stage reference resistor group are applied, as an LSB dynamic range, across the second-stage reference resistor group via inter-stage op-amps.

In the second-stage reference resistor group, two voltage taps are selected according to a decoded LSB bit, and in response thereto, the two corresponding analog switches are turned on to select a finer analog voltage, for output via an op-amp (not shown in the figure) as an analog waveform signal.

FIG. 6A shows the input/output characteristics of the first-stage reference resistor group. Also, FIG. 6B shows the input/output characteristics of the second-stage reference resistor group.

According to the multi-stage resistive voltage dividing scheme, highly accurate D/A conversion output can be obtained, and also the number of reference resistors can be reduced. While 32 (=$2^5$) reference resistors are required for the 5-bit D/A converter in FIG. 4, only 12 (=$2^3+2^2$) resistors will do in FIG. 5.

Furthermore, the multi-stage resistive voltage dividing type D/A converter performs conversion by cascading a plurality of resistive voltage dividing D/A converters in multiple stages, whereby the load capacitance at the input of op-amps decreases, permitting high-speed operation. In an example shown in FIG. 5, the first stage is formed of 8 (=$2^3$) serially connected reference resistors for a 3-bit MSB configuration, and the second stage is formed of 4 (=$2^2$) serially connected reference resistors for a 2-bit LSB configuration, thereby realizing the D/A converter for 5 bits in total. Thus, the load capacitance of the op-amps is suppressed to a value not greater than the total load capacitance of eight switches. If the sum of a capacitance of each switch and its wiring capacitance equals 10 fF, a capacitance connected to the input of the op-amps is approximately 8×10 fF=80fF, which is a marked reduction compared with that in the circuit configuration example shown in FIG. 4. Furthermore, according to the multi-stage resistive voltage dividing scheme, the configuration of the decoder, not shown, can be greatly simplified, allowing for lower power consumption.

The multi-stage resistive voltage dividing type D/A converter addresses a shortcoming that its D/A conversion characteristics is degraded by the offset voltage $V_{offset}$ of the inter-stage op-amps. When the reference voltage $V_{ref}$ i.e., the dynamic range of the D/A converter is sufficiently large, and when the voltage range $\Delta V$ per LSB is large with respect to the offset voltage $V_{offset}$ of the op-amps, the D/A conversion characteristics are not particularly affected.

SUMMARY OF THE INVENTION

However, along with future progress in processing and reduction of reference voltages $V_{ref}$ the dynamic range of the D/A converter may decrease, and so does the voltage range $\Delta V$ per LSB, from which one can easily guess that the offset voltage $V_{offset}$ of the op-amps is no longer negligible. Particularly, if the voltage range $\Delta V$ per LSB nears the offset voltage $V_{offset}$ of the op-amps, degradation in the D/A conversion characteristics, such as integral nonlinearity and differential nonlinearity, occurs noticeably.

When the op-amps are designed in an ordinary size, an offset voltage of approximately 5mV may occur. Meanwhile, in a 7-bit D/A converter whose dynamic range is 2V, the voltage range per LSB would be approximately 15.6mV, thus not posing a serious issue. However, as the supply voltage is decreased and the dynamic range becomes approximately 0.6V, the voltage range per LSB equals 4.7mV, thus aggravating the influence of the offset voltage.

Such an influence affects not only the D/A converter but other circuits as well. Typically, to decrease the offset voltage of the op-amps, the size of transistors at their input is increased. However, too large a size obstructs high-speed operation, and also pose an issue of increased chip size.

Accordingly, it is desirable to provides a resistive voltage dividing type D/A converter, which enables high-speed operation through a multi-stage configuration of reference resistor groups.

Furthermore, it is desirable to provide a D/A converter, capable of producing highly accurate D/A conversion output at high speed, by eliminating or alleviating the influence of the offset voltage of inter-stage output amplifiers caused by a decreased dynamic range.

The present invention has been made in view of the above and other issues.

A D/A converter includes:

an (N−1)-stage reference resistor group including serially connecting a plurality of reference resistors, the (N−1)-stage reference resistor group extracting an (N−1)$^{th}$ reference voltage applied thereacross from two voltage taps selected in response to a result obtained by decoding an input digital waveform signal, and outputting a divided analog voltage;

an N-stage reference resistor group including serially connecting a plurality of reference resistors, an N-stage reference resistor group extracting an N$^{th}$ reference voltage applied thereacross from two voltage taps selected in response to a result obtained by decoding the input digital waveform signal, and outputting a divided analog voltage;

inter-stage op-amps applying the divided voltage outputted from the voltage taps of the (N−1)-stage reference resistor group, across both ends of the N-stage reference resistor group as the N$^{th}$ reference voltage;

a dynamic range expanding means for arranging the voltage taps in the (N−1)-stage reference resistor group so as to expand upward and downward, to expand an input dynamic range in the N-stage reference resistor group; and expansion resistors arranged respectively at both upper and lower ends of the N-stage reference resistor group in response to upward and downward expanded amounts of the dynamic range.

A multi-stage resistive voltage dividing type D/A converter is typically configured by connecting in parallel an (N−1)-stage reference resistor group and an N-stage reference resistor group. In the (N−1)-stage reference resistor group, a plurality of reference resistors are serially connected. In the N-stage reference resistor group, a plurality of reference resistors are serially connected. Taps for voltage from the (N−1)-stage reference resistor group are determined in response to an MSB bit decoded by a decoder, to divide an (N−1)$^{th}$ reference voltage applied across both ends of the (N−1)-stage reference resistor group. This divided voltage is applied across both ends of the N-stage reference resistor group via the inter-stage op-amps, thereby accommodating the dynamic range for an analog voltage to be outputted from the N-stage reference resistor group.

The multi-stage resistive voltage dividing type D/A converter is configured basically by connecting reference resistor groups in a resistive voltage dividing type D/A converter in multiple stages. Since its operating principle is based on the resistive voltage dividing scheme, the multi-stage D/A converter has satisfactory monotonously increasing property and differential nonlinearity. Furthermore, by suppressing the load capacitance of the inter-stage op-amps while reducing the number of reference resistors, the multi-stage D/A converter allows highly accurate D/A conversion output and high-speed operation.

In the multi-stage resistive voltage dividing type D/A converter, a reference voltage is applied across the LSB-side reference resistor group via the inter-stage op-amps. In view of this, if an operation voltage of circuit is decreased and a per-bit voltage range is decreased, the influence of the offset voltage $V_{offset}$ of the inter-stage op-amps becomes unnegligible, thereby causing an issue of degradation in the D/A conversion characteristics.

In an embodiment of the present invention, the voltage taps in the (N−1)-stage reference resistor group are arranged so as to expand upward and downward, thereby expanding the dynamic range in the N-stage reference resistor group. Furthermore, the expansion resistors are respectively serially provided at both upper and lower ends of the N-stage reference resistor group in response to the upward and downward expanded amounts of the dynamic range. Since a desired divided voltage is extracted from voltage taps arranged between the original reference resistors excluding the expansion resistors, of the reference resistors in the N-stage reference resistor group, the output dynamic range remains unchanged.

By arranging the voltage taps in the (N−1)-stage reference resistor group to expand upward and downward, the input dynamic range $V_0$ to the N-stage reference resistor group can be expanded. Furthermore, even if the dynamic range for the N-stage reference resistor group is expanded, the offset voltage $V_{offset}$ in the inter-stage op-amps does not change. Meanwhile, by providing expansion resistors which correspond to the upward and downward expanded amounts between the voltage taps in the (N−1)-stage reference resistor group, at the upper and lower ends of the N-stage reference resistor group, respectively, the ratio of an offset voltage $V_{offset}$ contained in the per-bit voltage range $\Delta V$ formed for each reference resistor can be reduced.

While the N-stage reference resistor group has its input dynamic range expanded upward and downward, its voltage taps are arranged within its original output dynamic range, whereby a finer analog voltage value can be selected for a voltage level outputted from the (N−1)-stage reference resistor group.

For example, if the resistance value of each reference resistor is R, in the (N−1)-stage reference resistor group, an actual voltage tap is set upward by R/2 of an upper voltage tap determined in response to the result obtained by decoding the input digital waveform signal, and also the other actual voltage tap is set downward of a lower voltage tap by R/2.

Furthermore, in the N-stage reference resistor group, the expansion resistors, each including K series-connected reference resistors, are provided respectively at both upper and lower ends of a group of 2K reference resistors for which the voltage taps are arranged.

In such a case, since the per-bit voltage range outputted from the (N−1)-stage reference resistor group doubles to $2V_0$, the influence of the offset voltage $V_{offset}$ derived from the inter-stage op-amps can be reduced.

Furthermore, the input dynamic range inputted to the LSB-side N-stage reference resistor group from, the MSB-side (N−1)-stage reference resistor group is doubled to $2V_0$, and this input dynamic range is divided by 4K reference resistors. A divided analog voltage is outputted from the voltage taps arranged only between 2K ones of these 4K reference resistors. Hence, the output dynamic range of the LSB side remains unchanged at $V_0$.

According to the present invention, there is provided a D/A converter that can operate at high speed and produce highly accurate D/A conversion, output, by eliminating or alleviate the influence of the offset voltage of the inter-stage op-amps caused by a decreased dynamic range.

The multi-stage resistive voltage dividing type D/A converter according to the present invention outputs a divided voltage from voltage taps arranged so as to expand the dynamic range upward and downward in the MSB-side reference resistor group, and extracts only a desired portion of the expanded dynamic range in the LSB-side reference resistor group, whereby the influence of the offset voltage of the inter-stage op-amps exerted on the downstream stage can be reduced. In other words, the D/A converter eliminates or alleviates the influence of the offset voltage of the inter-stage op-amps without increasing the size of transistors at the input, and thus it can realize high-speed D/A converting operation.

Further objects, features and advantages of the present invention will become apparent from a more detailed description that is based on later-described embodiments of the present invention and accompanying drawings.

BRIEF DESCRIPTION OF THE DRAWINGS

FIGS. 1A and 1B are diagrams showing now voltage taps in an MSB-side reference resistor group are arranged so as to expand upward, and downward, in comparison with related art voltage taps;

FIG. 3B is a diagram showing input/output characteristics in the LSB-side reference resistor group shown in FIG. 2B;

DETAILED DESCRIPTION OF THE EMBODIMENTS

Figures 2A, 2B:
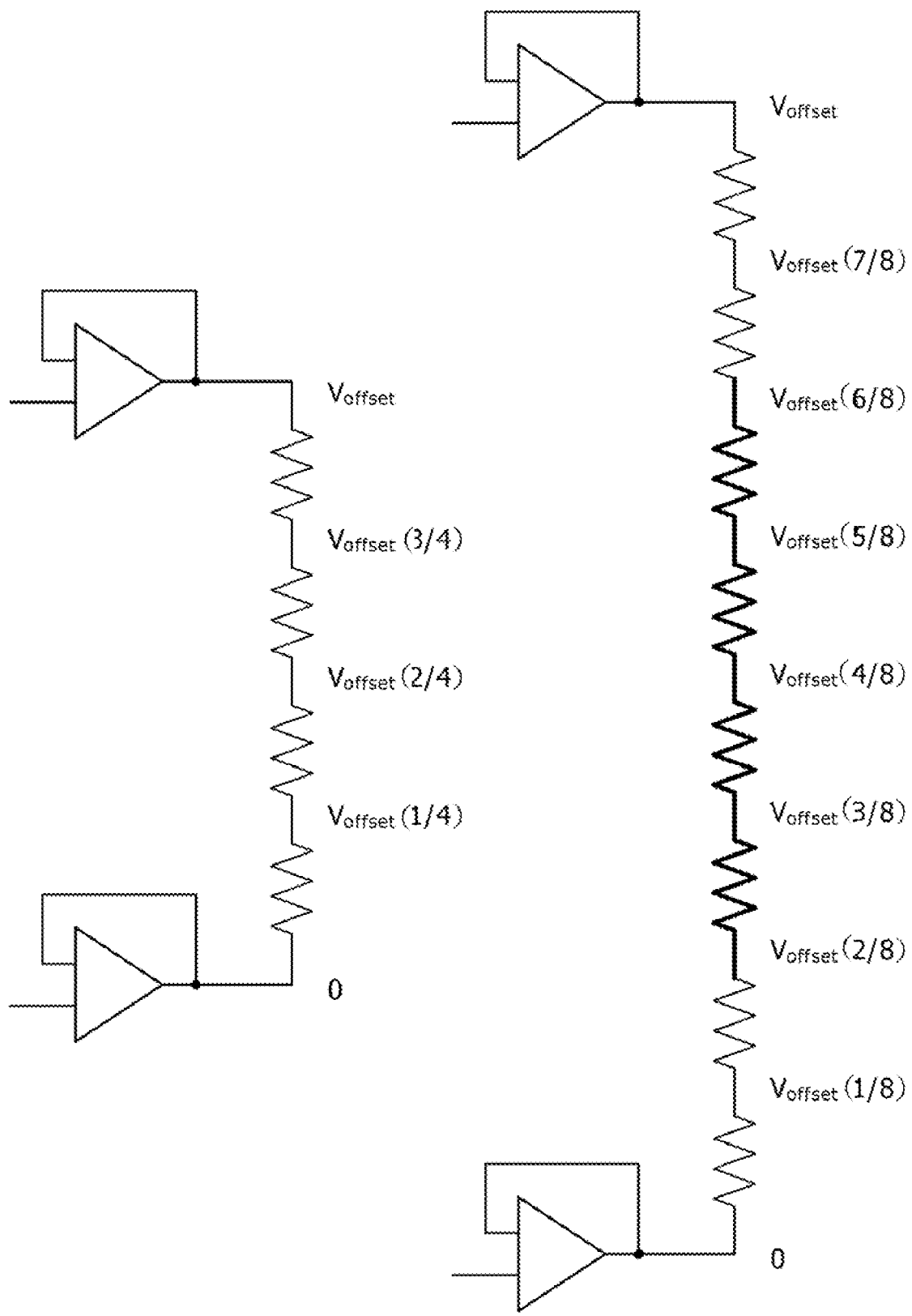
FIGS. 2A and 2B are diagrams showing how expansion resistors are serially arranged respectively at both upper and lower ends of an LSB-side reference resistor group in response to upward and downward expanded amounts of an input dynamic range, in comparison with a related art reference resistor group.

Embodiments of the present invention will be described below in detail with reference to the accompanying drawings.

The present invention relates to a multi-stage resistive voltage dividing type D/A converter in which reference resistor groups are provided in multiple stages. The multi-stage resistive voltage dividing type D/A converter can produce highly accurate D/A conversion output while reducing the number of reference resistors. Since its operating principle is based on the resistive voltage dividing scheme, the D/A converter exhibits satisfactory monotonously increasing property and differential nonlinearity. Compared with the single-stage resistive voltage dividing scheme, the multi-stage scheme can suppress the load capacitance of inter-stage op-amps, thus permitting high-speed operation.

However, in the multi-stage resistive voltage dividing type D/A converter, the dynamic range given to the LSB-side reference resistor group is decreased. Hence, as operation voltages of circuits are further reduced, the influence of the offset voltage $V_{offset}$ of the inter-stage op-amps can no longer be neglected, causing an issue of degradation in the D/A conversion characteristics, such as integral nonlinearity (INL) and differential nonlinearity (DNL).

In the present invention, voltage taps in the MSB-side reference resistor group are arranged so as to expand upward and downward, to expand the dynamic range given to the LSB-side reference resistor group, and in the LSB-side reference resistor group, expansion resistors are serially arranged respectively at both upper and lower ends of the LSB-side reference resistor group in response to the upward and downward expanded amounts of this input dynamic range.

By arranging the voltage taps in the MSB-side reference resistor group so as to expand upward and downward, the input dynamic range applied across both ends of the LSB-side reference resistor group is expanded. Here, even if the dynamic range of the MSB-side reference resistor group is expanded, the offset voltage $V_{offset}$ of the inter-stage op-amps does not change. Hence, in the LSB-side reference resistor group, the ratio of an offset voltage $V_{offset}$ contained in a per-bit voltage range $\Delta V$ formed for each reference resistor can be reduced by the number of expansion resistors arranged respectively at the upper and lower ends.

Of the LSB-side reference resistors, a desired divided voltage is extracted from voltage taps arranged between the original reference resistors excluding the expansion resistors, and thus, the output dynamic range remains unchanged. Namely, while reducing the influence of the offset voltage contained in the per-bit voltage range, a finer analog voltage value can be selected for a voltage level outputted from the MSB-side reference resistor group.

FIGS. 1A and 1B show how voltage taps in the MSB-side reference resistor group are arranged so as to expand upward and downward, in comparison with related art voltage taps.

In the related art, a voltage tap has been interposed between series-connected reference resistors, as shown in FIG. 1A. Therefore, if the resistance value of a reference resistor is R and that a voltage drop per reference resistor is V0, this is the dynamic range applied across the LSB-side reference resistor group.

By contrast, in an embodiment of the present invention, voltage taps to be selected according to a result obtained by decoding an input digital waveform signal are arranged so as to expand upward and downward each by R/2, as shown in FIG. 1B. As a result, the voltage drop expands by $V_0/2$ at each end, which further expands the divided voltage extracted from the voltage taps from $V_0$ to $2V_0$, providing $2V_0$ as the input dynamic range applied across the LSB-side reference resistor group. In one specific implementation method, a voltage is not extracted from the midpoints of the reference resistors as shown in the figure, but preferably, the size of the reference resistors is reduced to R/2 and each voltage tap is provided between such reference resistors.

Furthermore, FIGS. 2A and 2B show how expansion resistors are serially arranged respectively at both upper and lower ends of the LSB-side reference resistor group in response to the upward and downward expanded amounts of the input dynamic range, in comparison with a related art reference resistor group.

Where an LSB-side resistive voltage dividing type D/A converter is of a 2-bit configuration, in the related art, four reference resistors are series-connected, as shown in FIG. 2A. By contrast, in an embodiment of the present invention, the dynamic range is expanded upward and downward each by $V_0/2$ in the MSB side, as shown in FIG. 1B. Thus, in the LSB side, two reference resistors are serially connected as an expansion resistor to each end of four original reference resistors, as shown in FIG. 2B. In such a configuration, while the LSB-side reference resistor group in which the eight reference resistors are serially connected has a voltage drop of $2V_0$ as a whole, a voltage drop in the original reference resistor group (drawn with the solid line in the figure) consisting of the four series-connected reference resistors in the middle remains at $V_0$. Therefore, by arranging the voltage taps within this desired range, the dynamic range remains the same as original, and a finer analog voltage value can be selected for a voltage level outputted from the MSB-side reference resist or group.

Figure 3A:
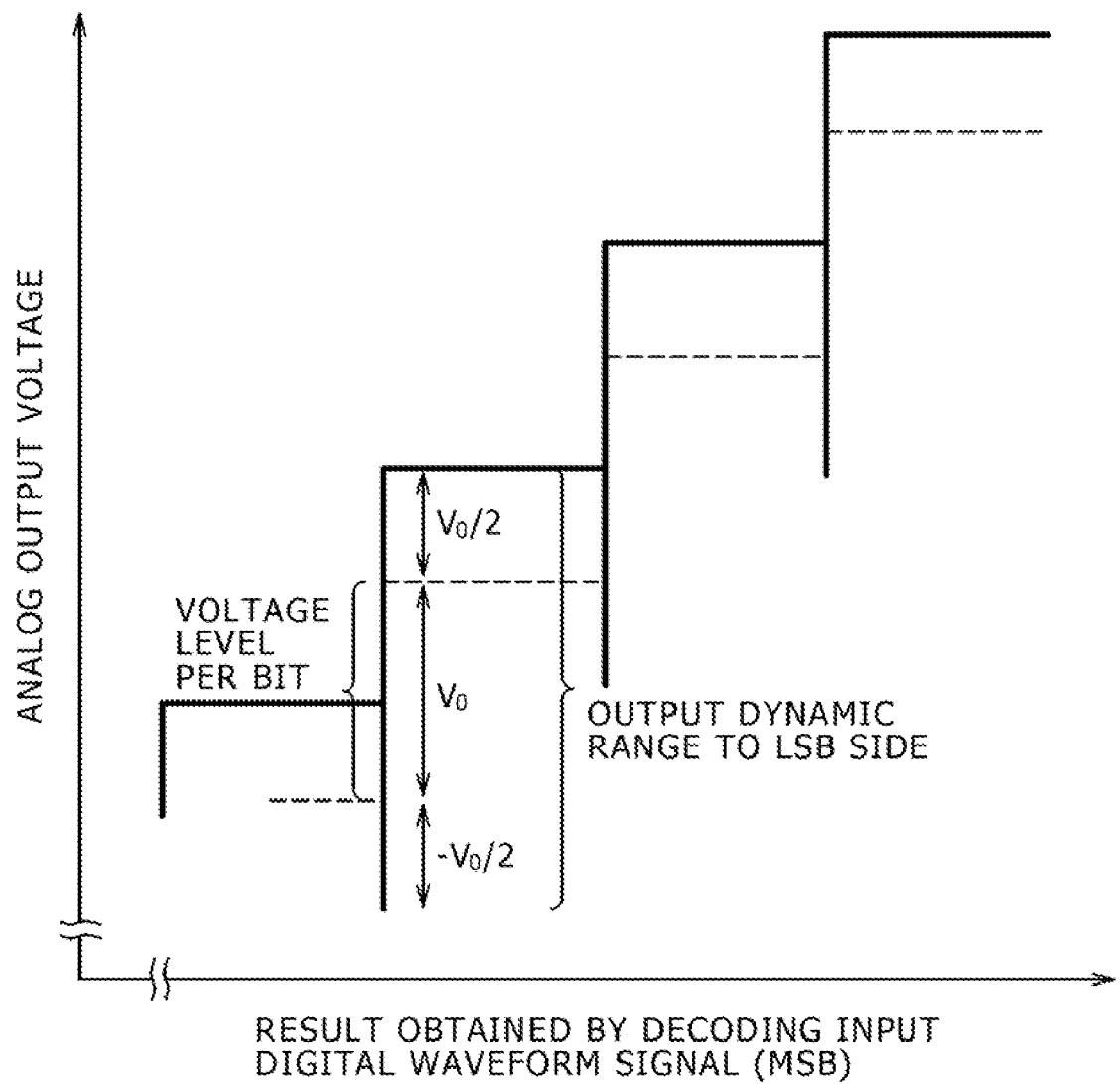
FIG. 3A is a diagram showing input/output characteristics in the MSB-side reference resistor group shown in FIG. 1B.
Figure 4:
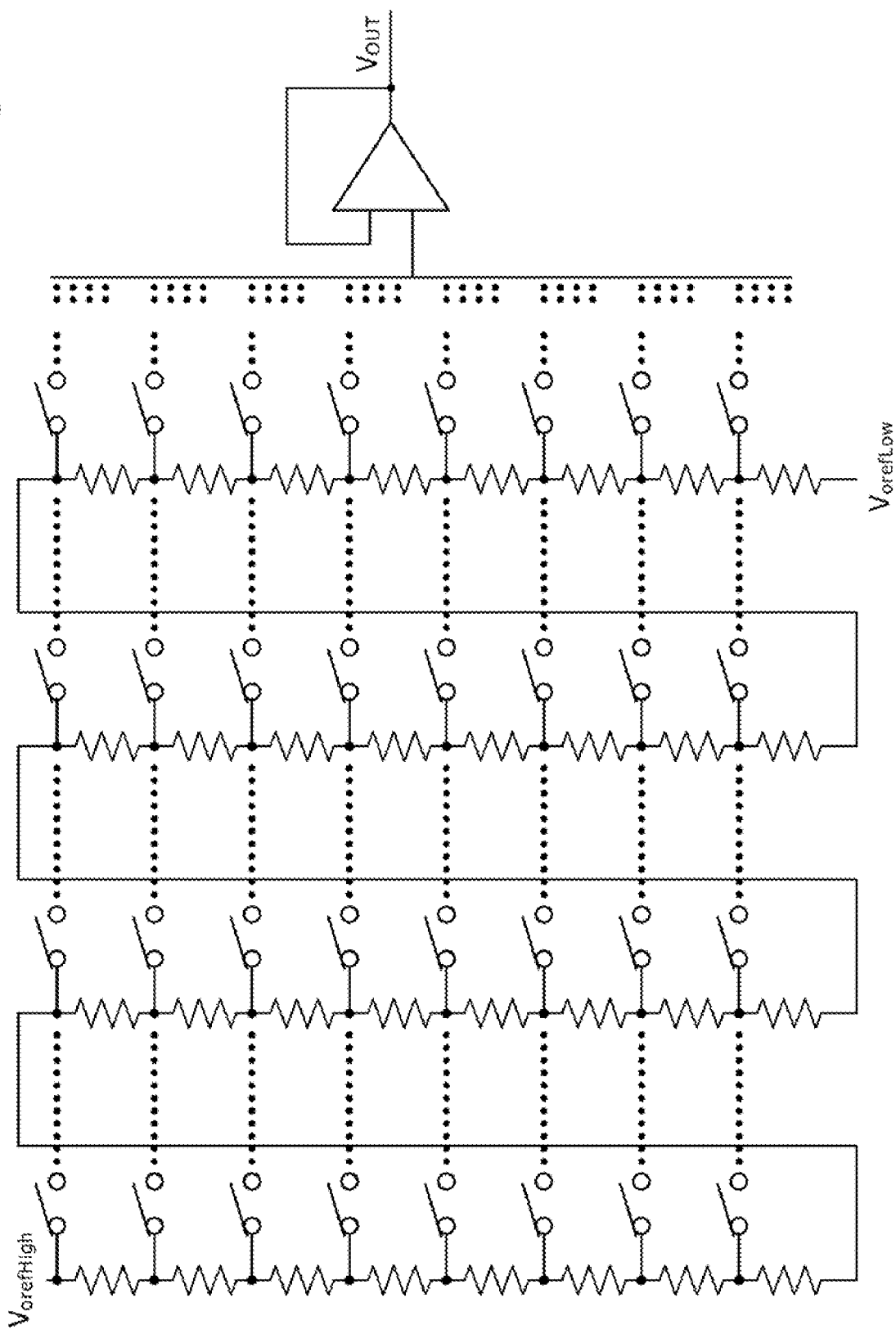
FIG. 4 is a diagram showing a configuration example of a 5-bit, 1-stage resistive voltage dividing type D/A converter.
Figure 5:
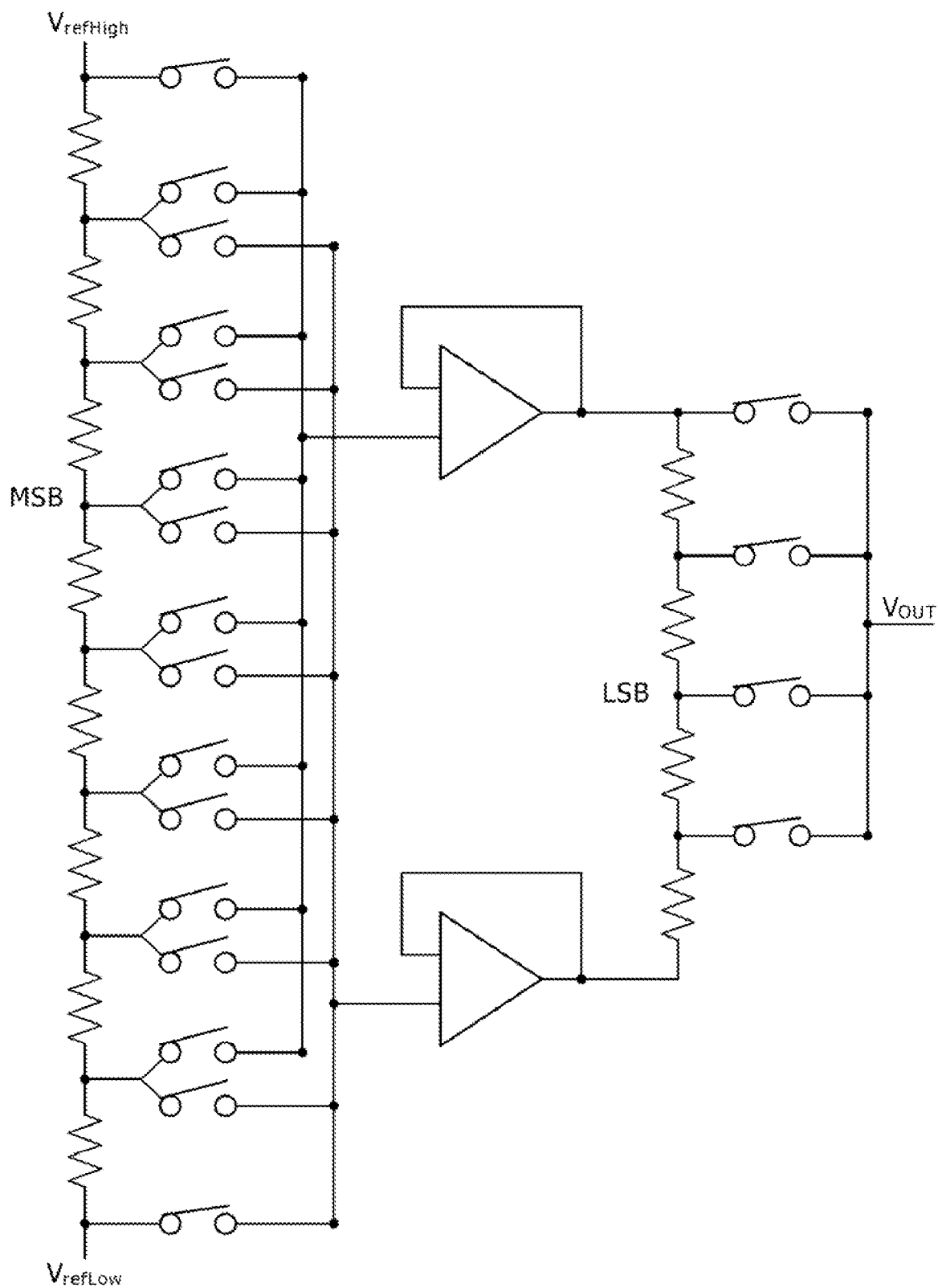
FIG. 5 is a diagram showing a configuration example of a two-stage multi-stage resistive voltage dividing type D/A converter.
Figure 6A:
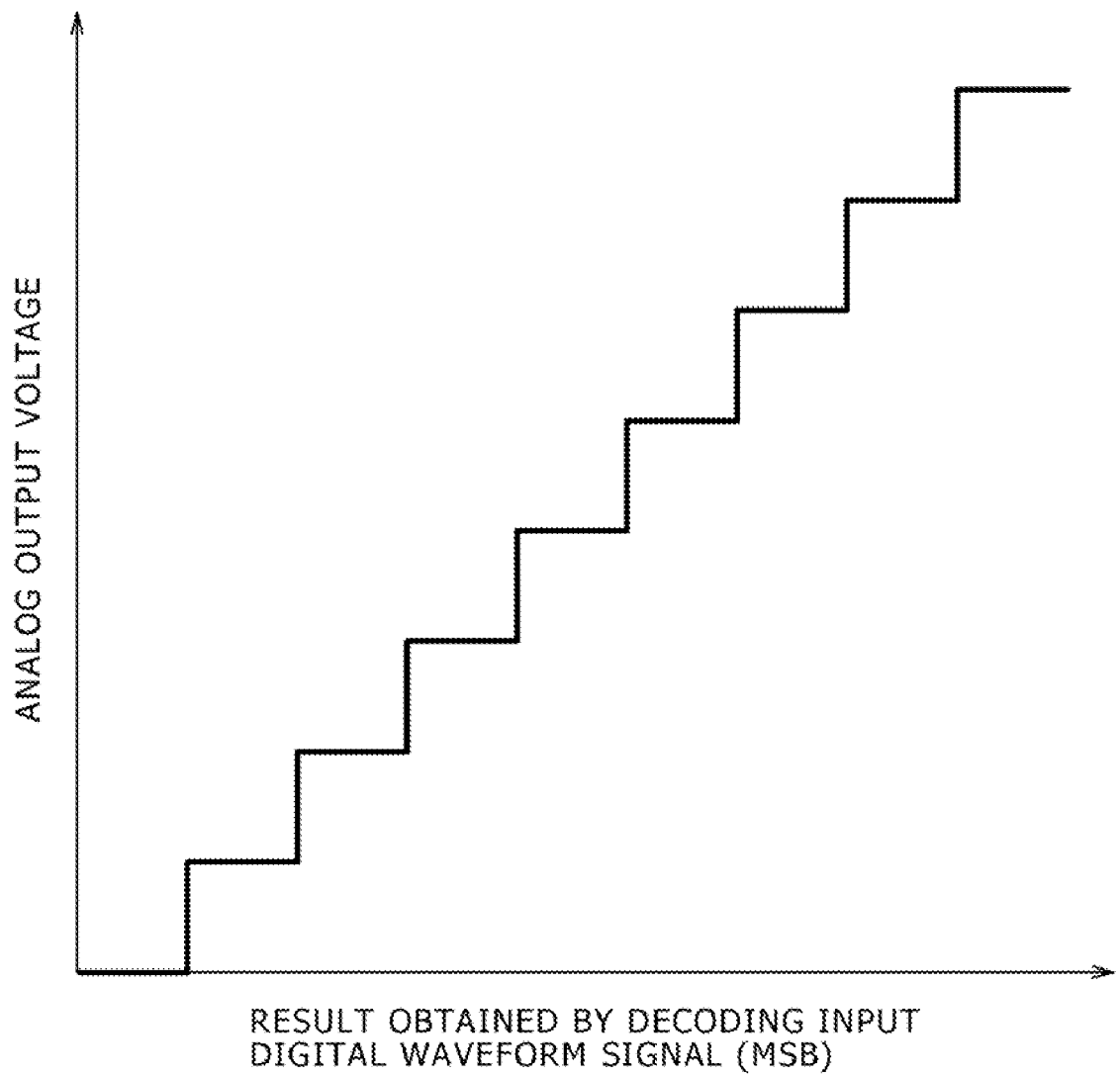
FIG. 6A is a diagram showing input/output characteristics in a first-stage reference resistor group of the multi-stage resistive voltage dividing type D/A converter shown in FIG. 5.
Figure 6B:
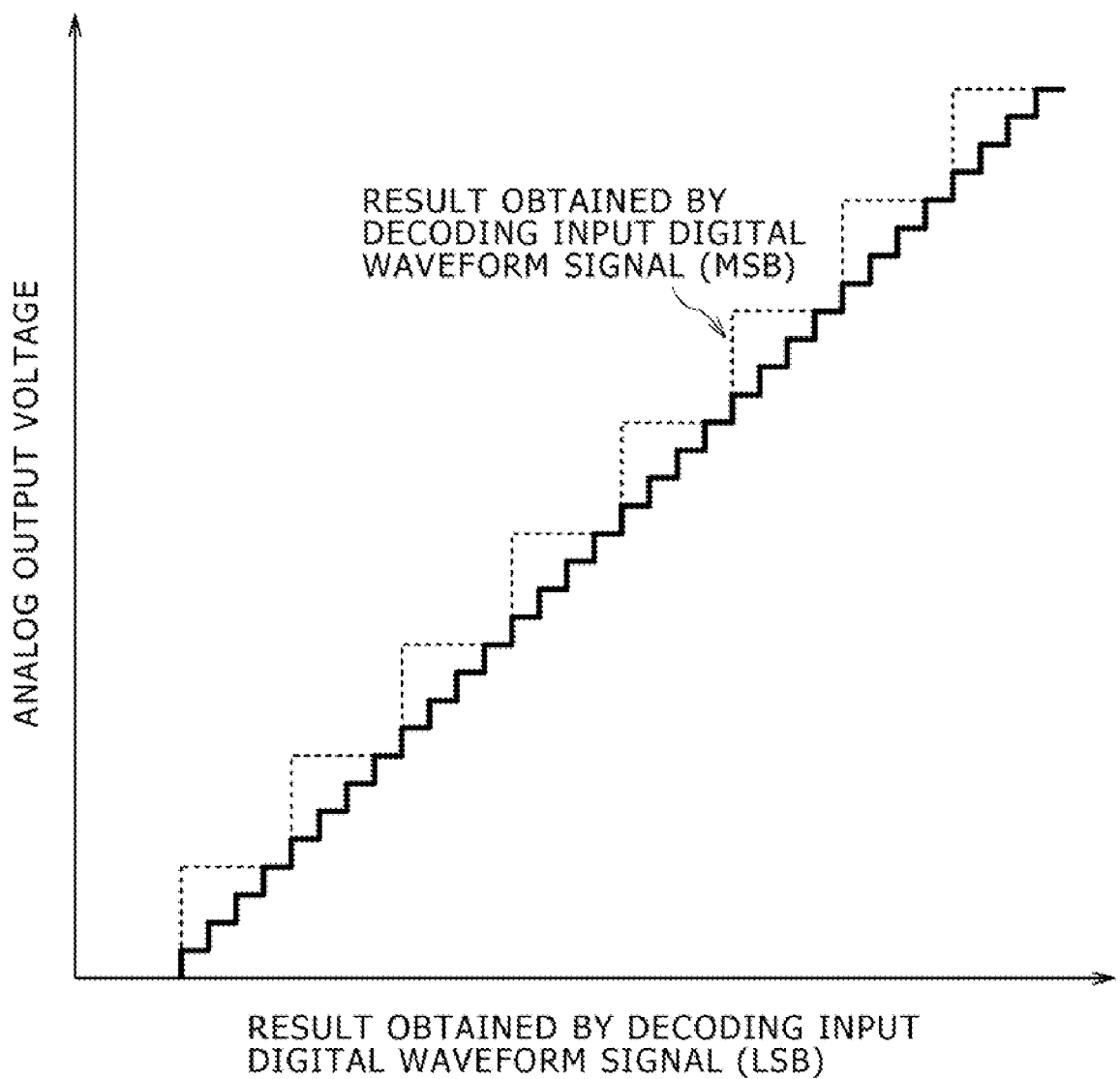
FIG. 6B is a diagram showing input/output characteristics in a second-stage reference resistor group of the multi-stage resistive voltage dividing type D/A converter shown in FIG. 5.

Solid lines of FIG. 3A indicate the input/output characteristics in the MSB-side reference resistor group shown in FIG. 1B, i.e., an analog output voltage inputted to the downstream (LSB-side) stage. Also, alternate long and two short dashed lines of FIG. 3B indicate the input characteristics in the LSB-side reference resistor group. Furthermore, alternate long and short dashed lines of FIG. 3B indicate an LSB High-Level voltage, i.e., a voltage $V_{offset}$ in FIG. 2B. The alternate long and two short dashed lines of FIG. 3B also indicate an LSB Low-Level voltage, i.e., zero volt of FIG. 2B. Thus, increasing the dynamic range causes the influence of the offset voltage of the op-amps to decrease. Broken lines of FIG. 3B indicate a voltage corresponding to the resistors drawn solid in FIG. 2B, i.e., an actually outputted voltage. As shown in FIG. 3A, in the MSB-side reference resistor group, the output dynamic range for each decoded value is expanded both upward and downward each by $V_0/2$, with a per-bit voltage range of $V_0$ as its base. Meanwhile, as shown in FIG. 3B, the middle range $V_0$ of the expanded input dynamic range $2V_0$ is used in the LSB-side reference resistor group. Therefore, the output dynamic range of the LSB-side reference resistor group shown in FIG. 2B is the same as that shown in FIG. 2A, and hence a finer analog voltage value is outputted for a voltage level outputted from the MSB-side reference resistor group.

The influence of the offset voltage of the inter-stage op-amps will be discussed. Even if the dynamic range of the MSB-side reference resistor group is expanded, the offset voltage $V_{offset}$ of the inter-stage op-amps remains unchanged. Meanwhile, the influence of the offset voltage $V_{offset}$ in the LSB side is distributed in the form of a voltage drop for each reference resistor. Therefore, the influence of the per-bit offset voltage formed for each reference resistor is $V_{offset}/4$ in the circuit configuration shown in FIG. 2A, whereas it is $V_{offset}/8$ in the circuit configuration shown in FIG. 2B. Namely, it is seen that the expansion of the dynamic range in the MSB side and the addition of the expansion resistors in the LSB side contribute to halving the influence of the offset voltage.

In the circuit configuration example shown in FIG. 1B, the voltage taps are arranged so as to expand upward and downward each by R/2 in the MSB-side reference resistor group. The scope of the present invention is not limited to this. Alternatively, when the voltage taps are arranged so as to expand upward and downward each by R in the MSB-side reference resistor group, an expansion resistor consisting of four series-connected reference resistors is arranged at each of the upper and lower ends in the LSB-side reference resistor group, which further reduces the influence of the per-bit offset voltage in the LSB side.

The present invention has been described above in great detail with reference to the specific embodiments. However, it is self-explanatory that those skilled in the art can make modifications to and substitutions for the embodiments without departing from the scope of the present invention.

The issue of the offset voltage in the op-amps is not addressed in the D/A converter alone, and thus the technical idea of the present invention can be applied to various other circuit configurations. The above description has centered around the embodiments in which the present invention is applied to the multi-stage resistive voltage dividing type D/A converter. As long as inter-stage op-amps are provided in a multi-stage configuration and their offset voltage affects circuit characteristics, if upward and downward expanded ranges are provided according to the present invention, the influence of their offset voltage can be similarly reduced.

The present application contains subject matters related to Japanese Patent Application No. 2006-192439 filed in Japanese Patent Office on Jul. 13, 2006, the entire content of which being incorporated herein by reference.

It should be understood by those skilled in the art that various modifications, combinations, sub-combinations, and alterations may occur depending on design requirements and other factors insofar as they are within the scope of appended claims and equivalents thereof.

What is claimed is:

1. A D/A converter comprising:
an (N−1)-stage reference resistor group including serially connecting a plurality of reference resistors, the (N−1)-stage reference resistor group extracting an $(N-1)^{th}$ reference voltage applied thereacross from two voltage taps selected in response to a result obtained by decoding an input digital waveform signal, and outputting a divided analog voltage;
an N-stage reference resistor group including serially connecting a plurality of reference resistors, an N-stage reference resistor group extracting an $N^{th}$ reference voltage applied thereacross from two voltage taps selected in response to a result obtained by decoding the input digital waveform signal, and outputting a divided analog voltage;
inter-stage op-amps applying the divided voltage outputted from the voltage taps of the (N−1)-stage reference resistor group, across both ends of the N-stage reference resistor group as the $N^{th}$ reference voltage;
a dynamic range expanding means for arranging the voltage taps in the (N−1)-stage reference resistor group so as to expand upward and downward, to expand an input dynamic range in the N-stage reference resistor group; and
expansion resistors arranged respectively at both upper and lower ends of the N-stage reference resistor group in response to upward and downward expanded amounts of the dynamic range.

2. The D/A converter according to claim 1, wherein a resistance value of each of the reference resistors is R,
the dynamic range expanding means sets one of the voltage taps upward by R/2 of an upper one of the voltage taps selected in response to the result obtained by decoding the input digital waveform signal, and sets the other one of the voltage taps downward by R/2 of a lower one of the voltage taps; and
in the N-stage reference resistor group, the expansion resistors, each including K series-connected reference resistors, are arranged respectively at both upper and lower ends of a group of 2K reference resistors for which the voltage taps are arranged.

* * * * *